(12) United States Patent
Wang

(10) Patent No.: US 11,095,257 B1
(45) Date of Patent: Aug. 17, 2021

(54) METHOD FOR HIGH-POWER COMBINING

(71) Applicant: LOCKHEED MARTIN CORPORATION, Bethesda, MD (US)

(72) Inventor: Li Leah Wang, Fremont, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 162 days.

(21) Appl. No.: 16/378,381

(22) Filed: Apr. 8, 2019

(51) Int. Cl.
*H03F 3/24* (2006.01)
*H03F 3/60* (2006.01)

(52) U.S. Cl.
CPC ............... *H03F 3/24* (2013.01); *H03F 3/605* (2013.01); *H03F 2200/432* (2013.01); *H03F 2203/21106* (2013.01)

(58) Field of Classification Search
CPC ...... H03F 3/24; H03F 3/605; H03F 2200/432; H03F 2203/21106
USPC .......................................................... 330/54
See application file for complete search history.

(56) References Cited

U.S. PATENT DOCUMENTS

2015/0152833 A1\* 6/2015 Mongin .................. H03F 3/211
123/623

\* cited by examiner

*Primary Examiner* — Robert J Pascal
*Assistant Examiner* — Kimberly E Glenn
(74) *Attorney, Agent, or Firm* — Morgan, Lewis & Bockius LLP

(57) ABSTRACT

An apparatus for high-power combining includes multiple power-combining building blocks, a passive input network to couple one or more input signals to one or more input ports of the multiple power-combining building blocks, and a passive output network to couple to output ports of the multiple power-combining building blocks and to generate one or more amplified output signals. Each power-combining building block includes M high-power amplifiers (HPAs) coupled in parallel to a respective passive input network and a respective passive output network. A count of the multiple power-combining building blocks is determined based on a desired total number N of the HPAs and a number M of the HPAs in each power-combining building block.

20 Claims, 13 Drawing Sheets

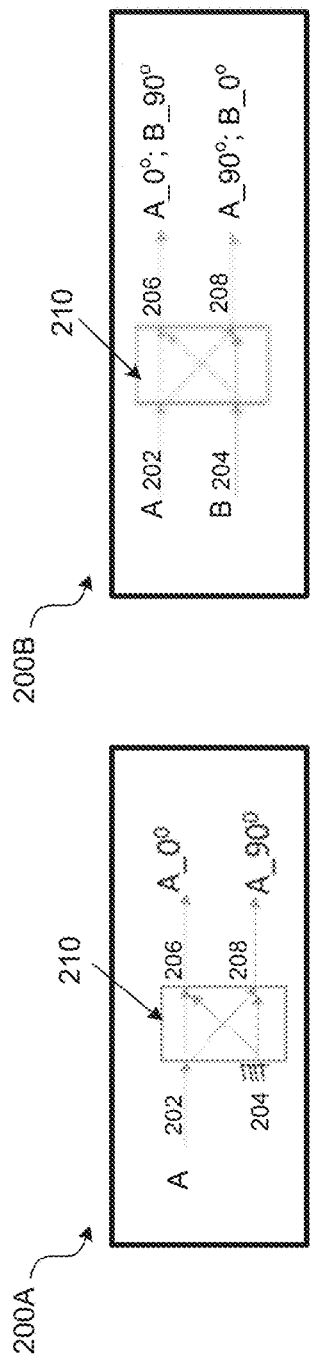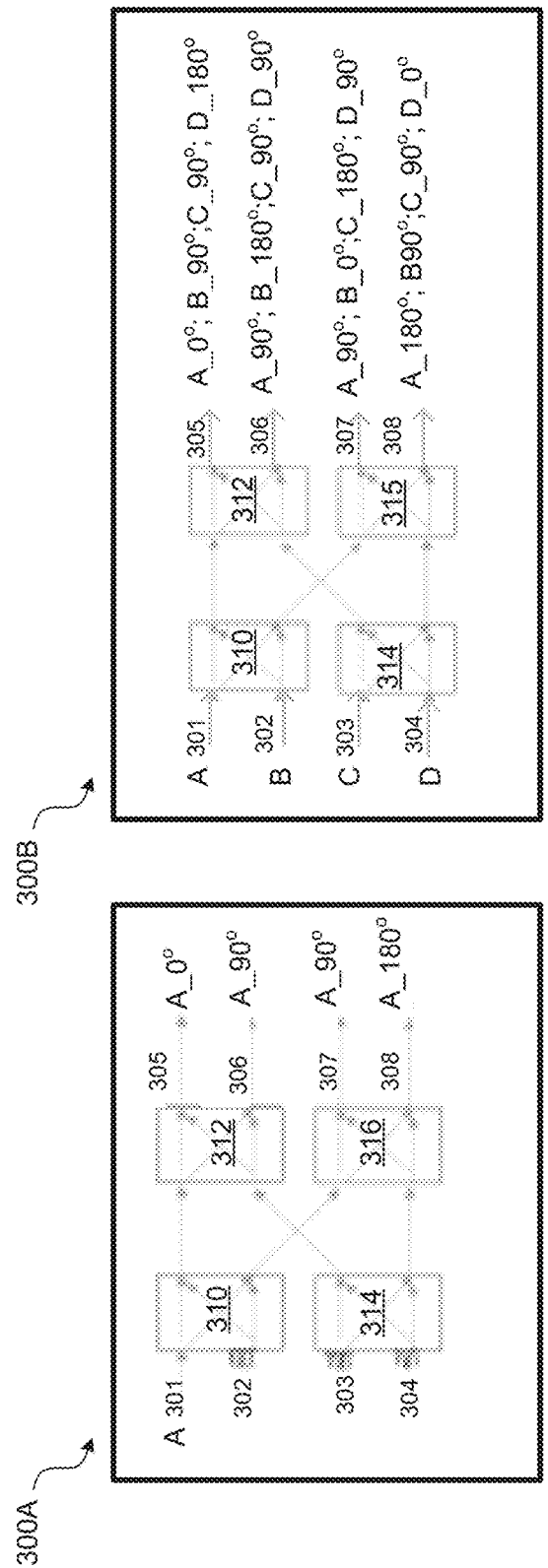

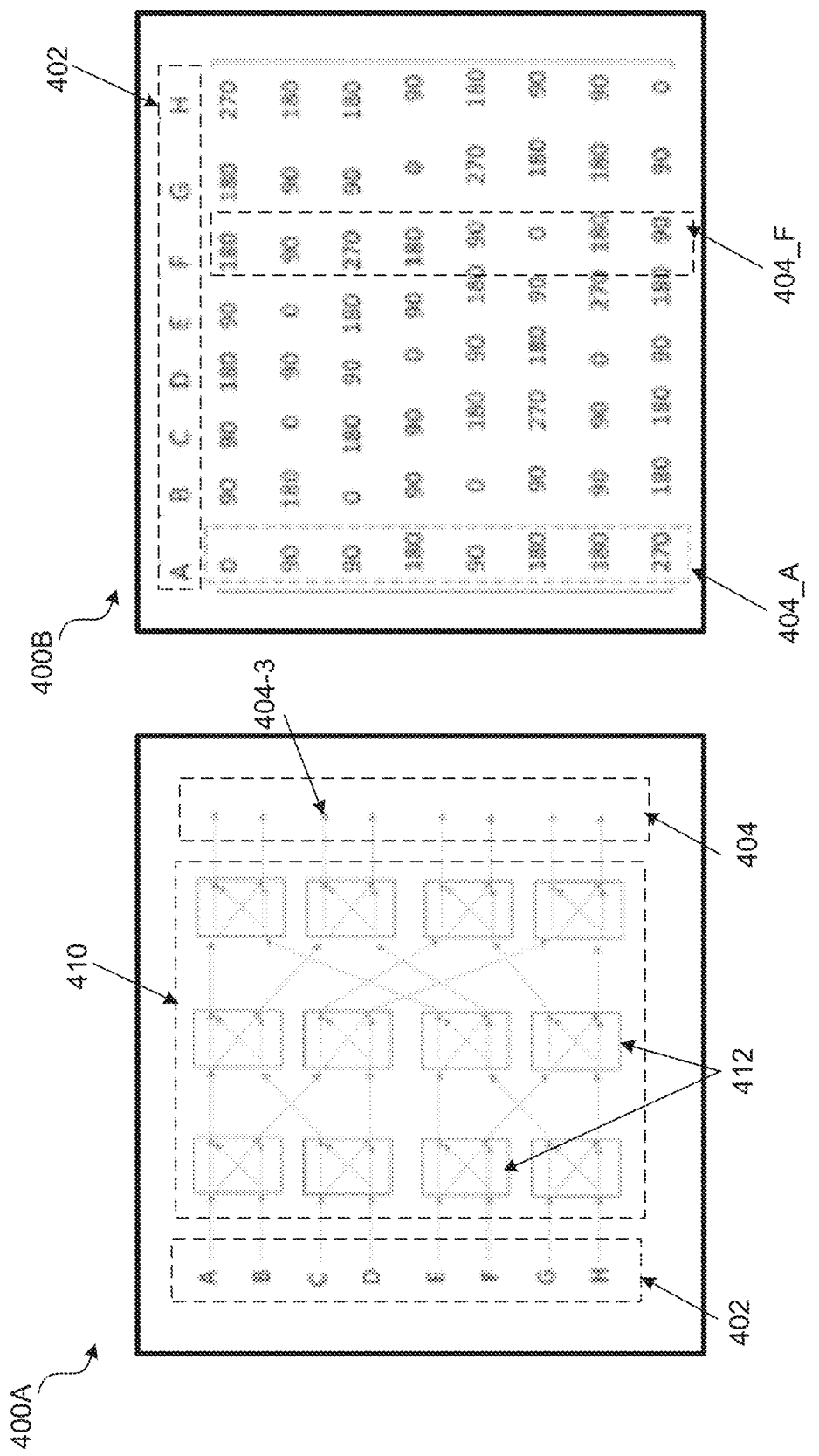

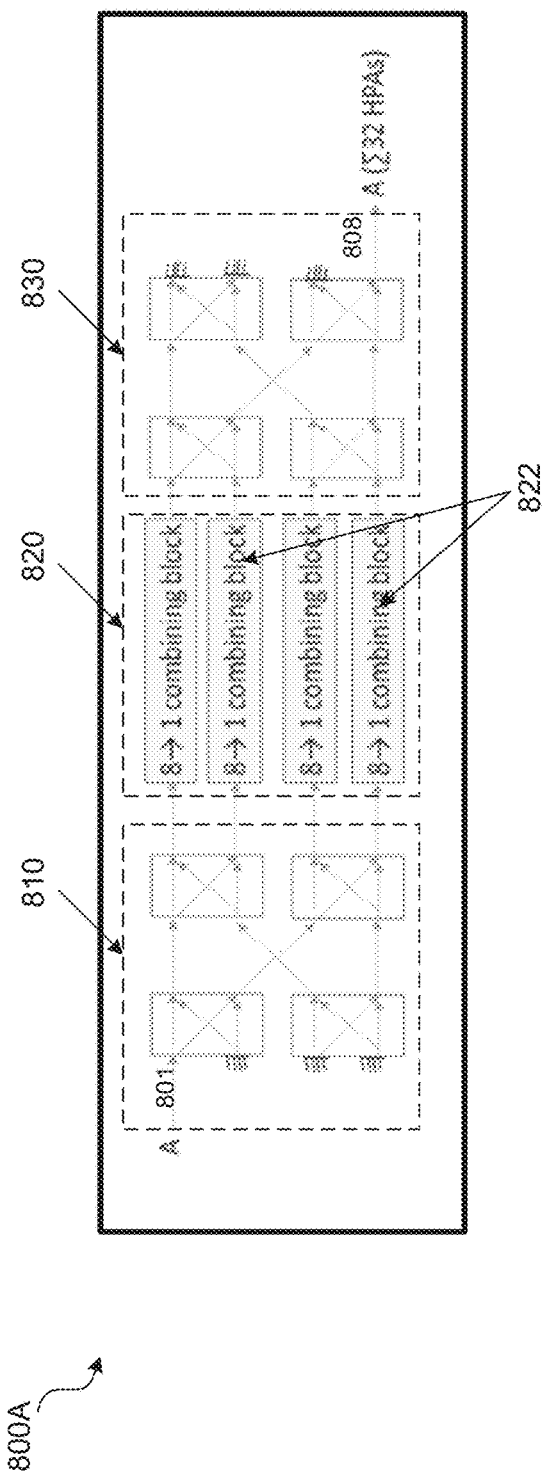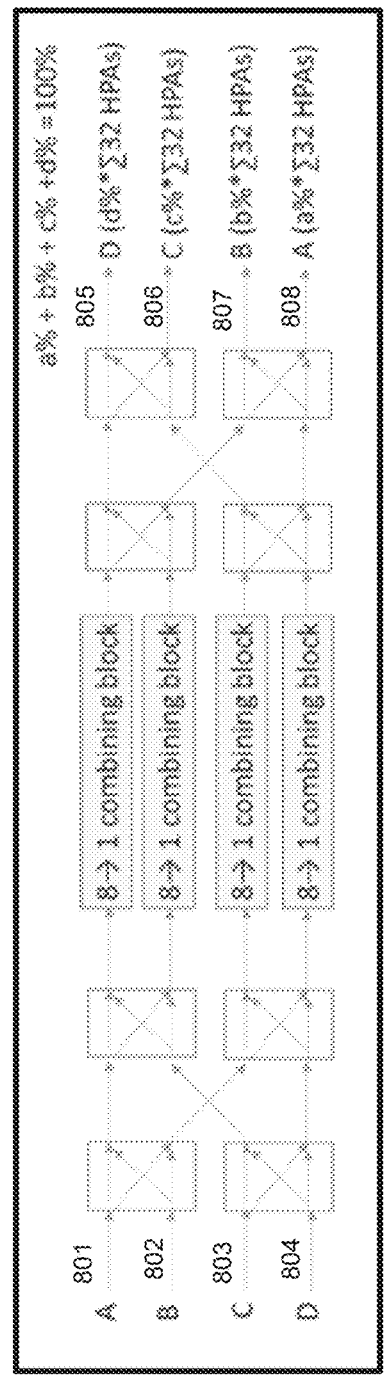
FIG. 8A
FIG. 8B

METHOD FOR HIGH-POWER COMBINING

STATEMENT REGARDING FEDERALLY SPONSORED RESEARCH OR DEVELOPMENT

Not applicable

FIELD OF THE INVENTION

The present invention generally relates to power combining, and more particularly to a simple and low-cost method for high-power combining.

BACKGROUND

High-power combining is employed in various types of communication payloads and applications that require a high level of equivalent isotropically radiated power (EIRP) output. In high-power combining, a number of high-power amplifiers (HPAs) such as traveling-wave tube amplifiers (TWTAs) or solid-state power amplifiers (SSPAs) are combined in power to produce the much higher-power output needed. The loss from the high-power combining has to be reduced to enhance the output power and efficiency. The most prevailing conventional high-power combining method is the cascaded-phase combining technique. In phase combining, every two TWTAs or SSPAs are combined in phase through 90-degree hybrids at a first stage. Every two of the combined outputs from the first stage are phase combined again at a second stage. The same process is carried on for subsequent stages until all high-power amplifiers are serially combined in a cascaded two-to-one phase-combining scheme. When a large number of TWTAs or SSPAs have to be combined, the cascaded-phase combining can take many stages to complete and the alignment process for all stages can become a nightmare. The cost associated with the cascaded combining of many high-power amplifiers can be prohibitive.

SUMMARY

According to various aspects of the subject technology, methods and configuration for simple and low-cost high-power combining are provided. In some aspects, the subject method is based on parallel combining by using a nested Butler matrix configuration. The disclosed solution combines all high-power amplifiers in parallel using Butler matrix-enabled passive input and output networks.

In some other aspects, an apparatus for high-power combining includes multiple power-combining building blocks, a passive input network to couple one or more input signals to one or more input ports of the multiple power-combining building blocks, and a passive output network to couple to output ports of the multiple power-combining building blocks and to generate one or more amplified output signals. Each power-combining building block includes M high-power amplifiers (HPAs) coupled in parallel to a respective passive input network and a respective passive output network. A count of the multiple power-combining building blocks is determined based on a desired total number N of the HPAs and a number M of the HPAs in each power-combining building block.

In other aspects, a method for high-power combining includes forming multiple power-combining building blocks. Each power-combining building is formed by a parallel combination of M HPAs. The method further includes coupling, through a passive input network, one or more input signals to one or more input ports of the multiple power-combining building blocks. One or more amplified output signals are generated by coupling a passive output network to output ports of the multiple power-combining building blocks. A count of the multiple power-combining building blocks is determined based on a desired total number N of the HPAs and a number M of the HPAs in each power-combining building block. Each power-combining building block of the multiple power-combining building blocks is coupled in parallel to a respective passive input network and a respective passive output network.

In yet other aspects, a power-combining building block includes a passive input network to generate phase variants of an input signal and a number of HPAs coupled in parallel to the passive input network to amplify the phase variants of the input signal to generate multiple phase-variant amplified output signals. The power-combining building block further includes a passive output network to combine the multiple phase-variant amplified output signals to generate an amplified output signal.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein:

FIGS. 2A and 2B are block diagrams illustrating 2×2 Butler matrix based passive networks with one and two inputs.

FIGS. 3A and 3B are block diagrams illustrating 4×4 Butler matrix passive networks with one and four inputs.

FIGS. 4A and 4B are block diagrams illustrating an 8×8 Butler matrix passive network along with a corresponding phase matrix.

FIGS. 8A and 8B are block diagrams illustrating example implementations of 32-to-1 power-combining building blocks with one and four inputs, according to certain aspects of the disclosure.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block-diagram form in order to avoid obscuring the concepts of the subject technology.

The present disclosure is directed, in part, to systems and configurations for providing methods and configuration for simple, compact and low-cost high power combining. In some aspects, the subject solution is based on parallel combining of high-power amplifiers (HPAs) using a nested Butler matrix configuration. The disclosed method combines all HPAs in parallel using Butler matrix-enabled passive input and output networks. The employed passive networks are advantageously off-the-shelf commercial components and can be obtained prealigned in both phase and amplitude. By nesting Butler matrices together, any number of HPAs can be combined in a very simple and compact configuration at low loss. The disclosed power-combining method requires minimum alignment, thus can drive down the cost significantly, especially when the number of HPAs to be combined is very large (e.g., 32 or more).

Figure 1A:
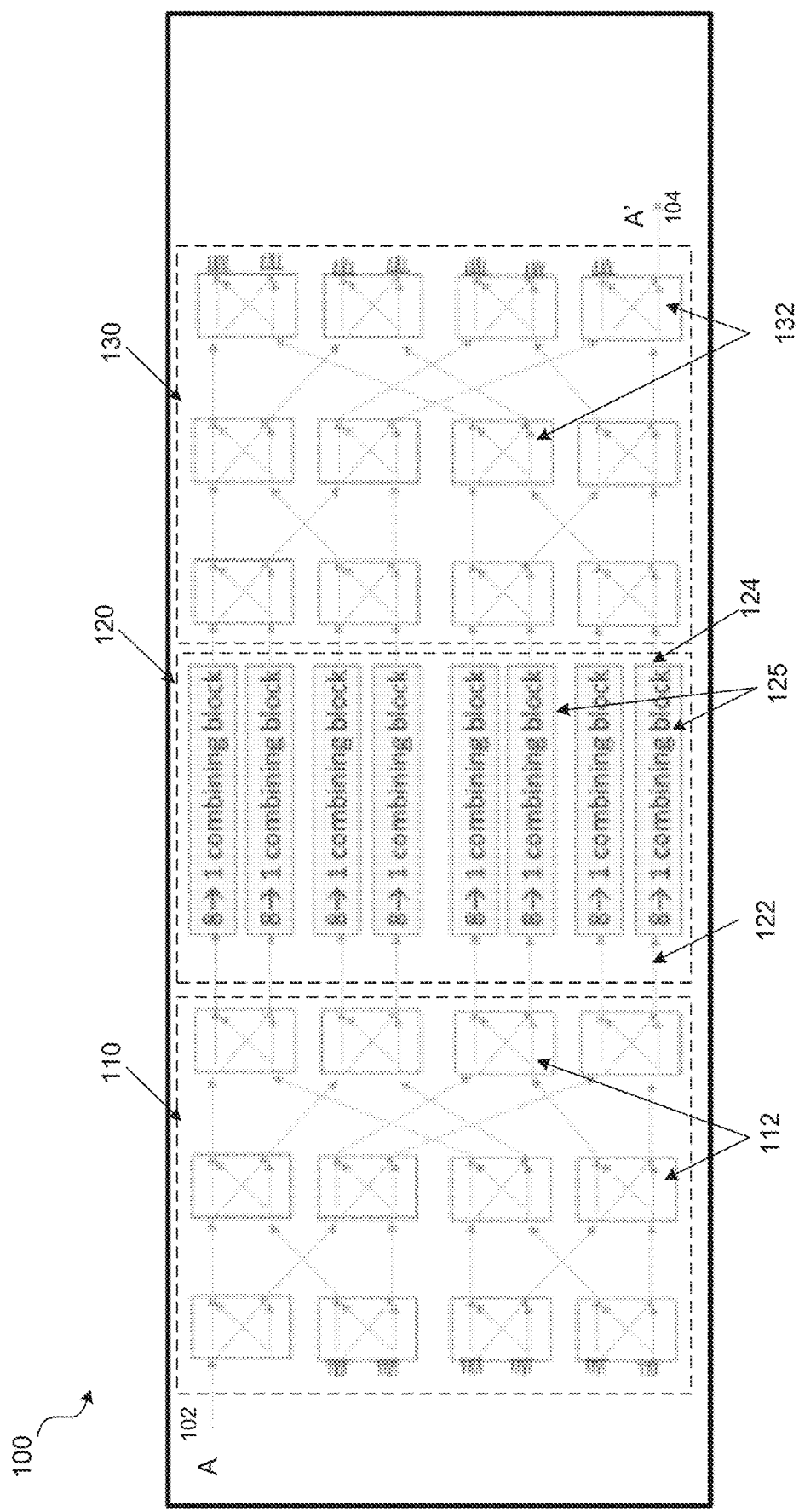
FIGS. 1A and 1B are block diagrams illustrating example implementations of a high-power-combining apparatus, according to certain aspects of the disclosure.
Figure 1B:
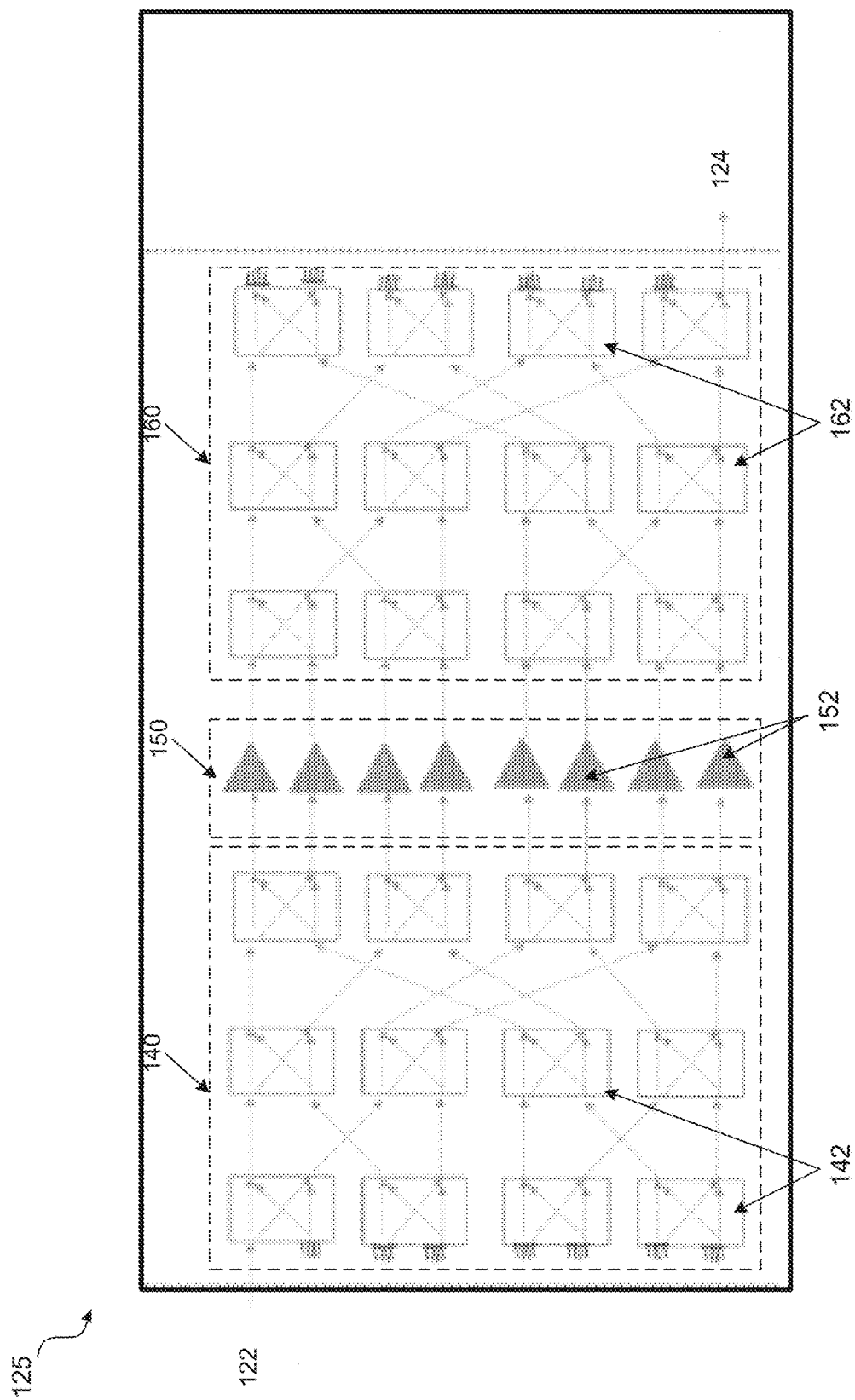

FIGS. 1A and 1B are block diagrams illustrating example implementations of a high-power-combining apparatus 100, according to certain aspects of the disclosure. The high-power-combining apparatus 100 includes a passive input network 110, a power-combining block 120 and a passive output network 130. The passive input network 110 is formed by using a number of Butler matrices 112, described in more detail herein, and is used to couple an input signal A received at a port 102 to the power-combining block 120. The power-combining block 120 comprises a number of power-combining building blocks 125 that are coupled in parallel to the passive input network 110. The passive input network 110 generates multiple phase-variant signals associated with the input signal A and provides them at inputs 122 of the power-combining building blocks 125.

The phase-variant signals are amplified by the HPAs of the power-combining building blocks. The amplified phase-variant signals are then combined by the passive output network 130 to form the amplified output signal A' at an output port 104. The passive output network 130 is formed of a combination of Butler matrices 132, which are similar to the Butler matrices 112 and receive the amplified phase-variant signals from output nodes 124 of the power-combining building blocks 125.

FIG. 1B shows an example implementation of the power-combining building block 125. The power-combining building block 125 includes a passive input network 140, an amplifier block 150 and a passive output network 160. The amplifier block 150 is formed of a number of HPAs 152 that are coupled in parallel with the passive input network 140. The passive input network 140 includes a number of Butler matrices 142 and generates phase-variant signals form the input signal provided at the input port 122. The HPAs 152 amplify the phase-variant signals, which are then combined by the passive output network 160 to generate an amplified output signal at an output port 124. The passive output network 160 is formed of multiple Butler matrices 162, which can combine the phase-variant signals, as discussed in more detail herein.

The power-combining building block 125 is the hearth of the subject technology that allows a compact and low-cost implementation of high-power combining using on-the-shelf parts such as Butter matrices and Butler matrix networks. The disclosed power-combining building blocks can be implemented with combination of different numbers of HPAs. For example, a power-combining building block of the subject technology can be, but is not limited to, a two-to-one, a four-to-one or an eight-to-one power-combining building block.

FIGS. 2A and 2B are block diagrams illustrating Butler matrix-based passive networks 200A and 200B with one and two inputs. The Butler matrix-based passive networks 200A include a Butler matrix 210 with two input ports 202 and 204 and two output ports 206 and 208. The input signal A is received at input port 202 and is processed by the internal circuitry of the Butler matrix 210 to generate two phase-variant output signals A_0° and A_90° with zero- and 90-degree phases, respectively. The A_0° signal is provided at the output port 206 and the A_90° signal is available at the port 208. The input port 204 is properly terminated, for example, by a load (e.g., a 50Ω resistance) or coupled to a ground potential.

The Butler matrix-based passive networks 200B includes the Butler matrix 210 that receives two input signals A and B at input ports 202 and 204. The input signals A and B are processed by the internal circuitry of the Butler matrix 210 to generate two phase-variant output signals at output ports 206 and 208. The output signal at the output port 206 is (A_0°; B_90°), which includes a copy of the input signal A (A_0°) and a phase variant (B_90°) of the input signal B with 90-degree phase with respect to the input signal B. The output signal at the output port 208 is (A_90°; B_0°), which includes a copy of the input signal B (B_0°) and a phase variant (A_90°) of the input signal A with 90-degree phase with respect to the input signal A.

FIGS. 3A and 3B are block diagrams illustrating 4×4 Butler matrix passive networks 300A and 300B with one and four inputs. The 4×4 Butler matrix passive network 300A includes four Butler matrices 310, 312, 314 and 316 and has four input ports (301, 302, 303 and 304) and four output ports (305, 306, 307 and 308). The input A is received at the input port 301 and other input ports (302, 303 and 304) are properly terminated or grounded, as needed. The output signals at the output ports (305, 306, 307 and 308) include phase variants of the input signal A, as shown in FIG. 3A. For example, the output signal at port 305 is copy of the input signal A (with zero-phase change), the output signals at ports 306 and 307 are A_90°, having 90-degree phase shift and the copy of the input and the output signal at ports 308 is A_180°, having 180-degree phase shift.

The 4×4 Butler matrix passive network 300B includes the four Butler matrices 310, 312, 314 and 315 and receive input signals A, B, C and D at the input ports (301, 302, 303 and 304). The output signals at the output ports (305, 306, 307 and 308) include combinations of phase variants of the input signals A, B, C and D, as shown in FIG. 3B. For example, the output signal at port 305 includes a copy of the input signal A (A_0°) and also includes phase variants of the input signals B and C with 90-degree phase shift (B_90° and C_90°) and of the input signal D with a 180-degree phase shift (D_180°). The other output signals also include similar combinations of variants of the input signals A, B, C and D, as shown in FIG. 3B.

FIGS. 4A and 4B are block diagrams illustrating an 8×8 Butler matrix passive network 400A along with corresponding phase matrix 400B. The 8×8 Butler matrix passive network 400A includes an input block 402, a passive Butler matrix network 410 and output signal 404. The input block 402 includes eight input signals (A, B, C, D, E, F, G and H). The passive Butler matrix network 410 includes a number of Butler matrices 412 that are configured as shown in FIG. 4A. The output signals 404 are phase variants of the input signals, as explained below with respect to the corresponding phase matrix 400B.

The corresponding phase matrix 400B include eight columns and eight rows. Each row corresponds to an output signal of the output signals 404. Each column corresponds to a different phase variant of a specific input signal. For example, column 404_A includes a list of eight phase variants of the input signal A, and column 404_F includes a list of eight phase variants of the input signal F. For instance, the third output signal 404-3 includes a combination of phase variants of input signals A, B, C, D, E, F, G and H with respective phases of 90°, 0°, 180°, 90°, 180°, 270°, 90°, and 180°. The other output signals 404 can be configured similarly based on entries of the phase matrix 400B.

Figure 5:
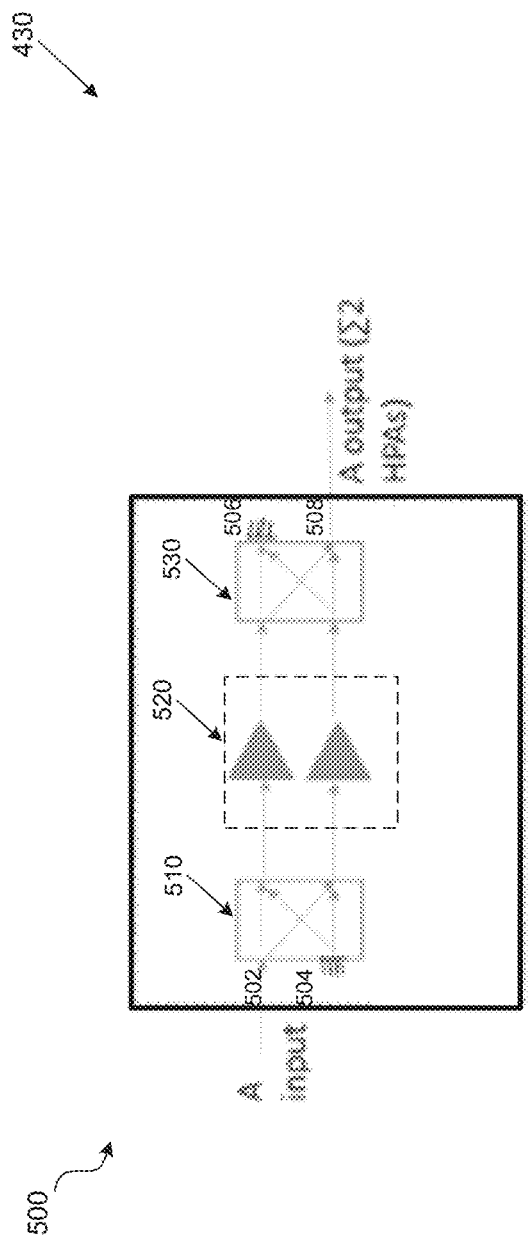
FIG. 5 is a block diagram illustrating an example implementation of a two-to-one power-combining building block, according to certain aspects of the disclosure.

FIG. 5 is a block diagram illustrating an example implementation of a two-to-one power-combining building block 500, according to certain aspects of the disclosure. The two-to-one power-combining building block 500 (hereinafter, building block 500) includes a Butler matrix-based passive input network 510 (hereinafter, input network 510), an amplifier block 520 and a Butler matrix-based passive output network 530 (hereinafter, output network 530). The input network 510 is a 2×2 Butler matrix with two input ports 502 and 504. An input signal A is received at the input port 502, and the input port 504 is terminated. The input network 510 provides two phase-variant signals that are received by the amplifier block 520. The amplifier block 520 includes two parallel-connected HPAs and can amplify the two phase-variant signals. The output network 530 includes a 2×2 Butler matrix with two output ports 506 and 508. The output port 506 is terminated, and an amplified output signal, which is a combination of two amplified phase-variant signal is provided at the output port 508. The combination is provided by bringing back the two phases of the amplified phase-variant signals to the same phase (e.g., zero degree).

Figure 6:
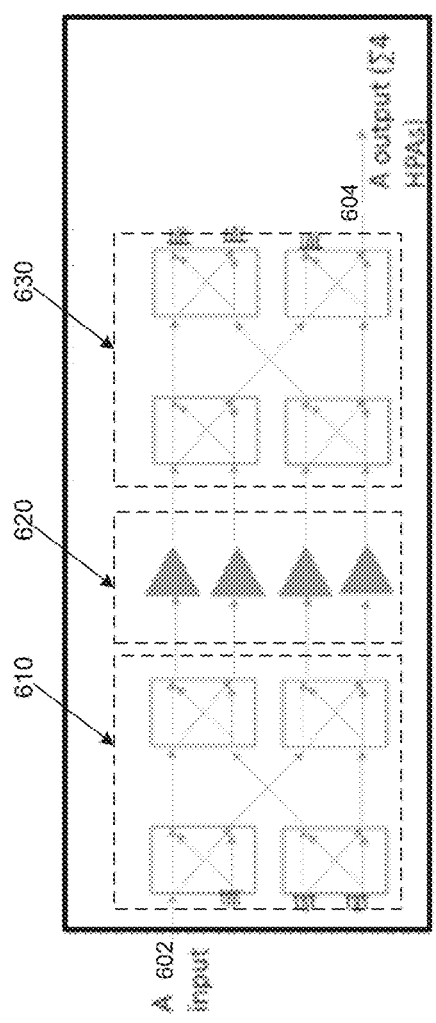
FIG. 6 is a block diagram illustrating an example implementation of a four-to-one power-combining building block, according to certain aspects of the disclosure.

FIG. 6 is a block diagram illustrating an example implementation of a four-to-one power-combining building block 600, according to certain aspects of the disclosure. The four-to-one power-combining building block 600 (hereinafter, building block 600) includes a Butler matrix-based passive input network 610 (hereinafter, input network 610), an amplifier block 620 and a Butler matrix-based passive output network 630 (hereinafter, output network 630). The input network 610 is a 4×4 passive network with four input ports, three of which are terminated and a fourth one is an input port 602. The input port 602 receives an input signal A and provides four phase-variant signals that are amplified (e.g., by a power gain of G) by the amplifier block 620. The amplifier block 620 includes four parallel-connected HPAs and provides four amplified phased-variant signals to the output network 630. The output network 630 includes a 4×4 passive network with an active output port 604 and three are terminated output ports. An amplified output signal, which is a combination of the four amplified phase-variant signal is provided at the output port 604. The combination is provided by bringing back the four phases of the amplified phase-variant signals to the same phase (e.g., zero degree). The amplified output signal at the output port 604 has 4G times the power of the input signal A.

Figure 7A:
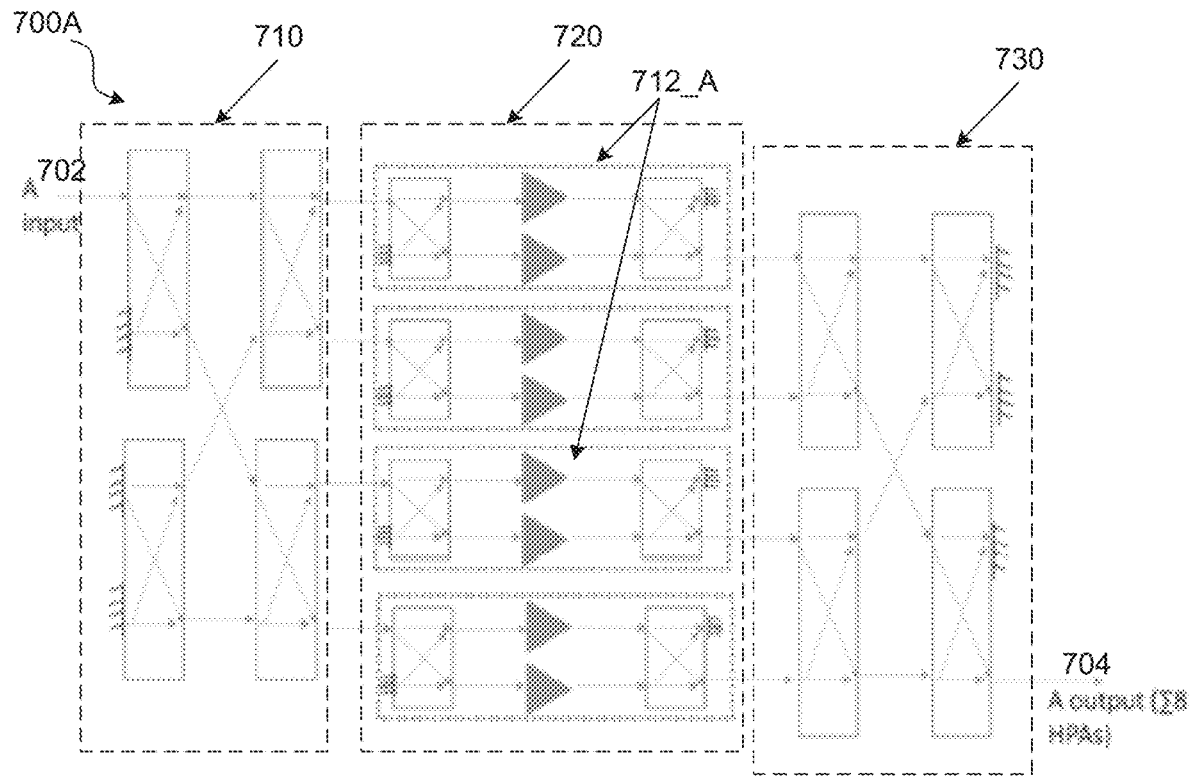
FIGS. 7A and 7B are block diagrams illustrating an example implementation of an eight-to-one power-combining building block and corresponding simplified representation, according to certain aspects of the disclosure.
Figure 7B:
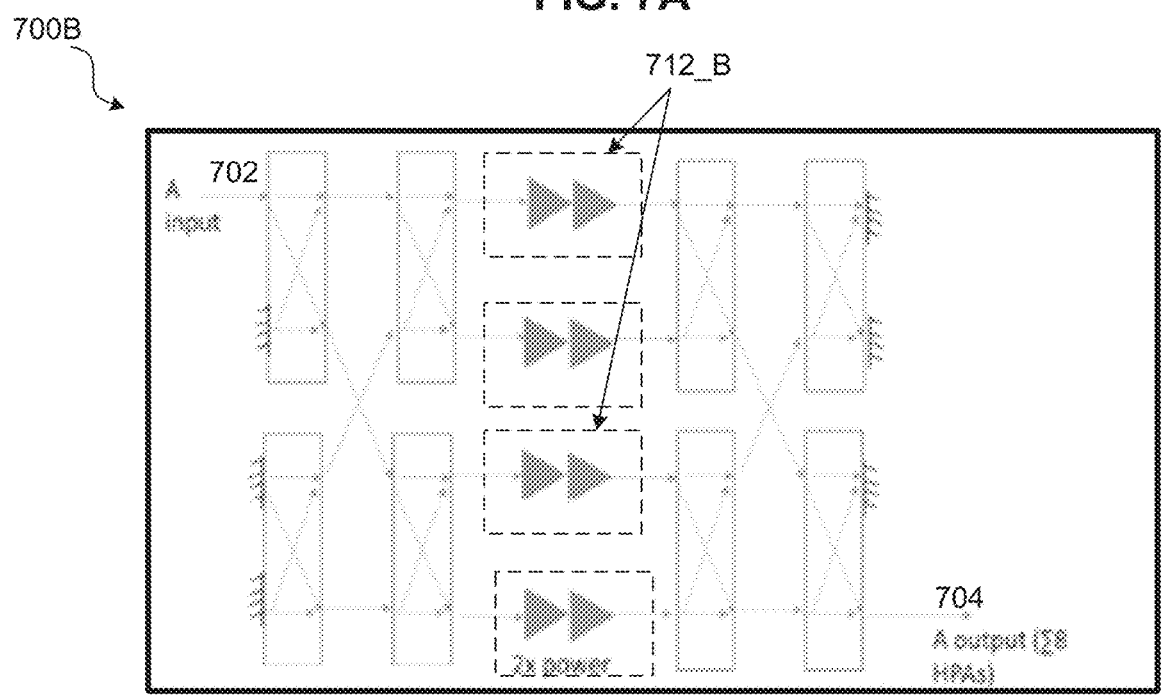

FIGS. 7A and 7B are block diagrams illustrating an example implementation of an eight-to-one power-combining building block 700A and corresponding simplified representation 700B, according to certain aspects of the disclosure. The eight-to-one power-combining building block 700A (hereinafter, building block 700A) includes a Butler matrix-based passive input network 710 (hereinafter, input network 710), an amplification block 720 and a Butler matrix-based passive output network 730 (hereinafter, output network 730). The input network 710 is a 4×4 passive network with four input ports, three of which are terminated and a fourth one is an input port 702. The input port 702 receives an input signal A and provides four phase-variant signals that are amplified (e.g., by a power gain of G) by the amplifier block 720. The amplification block 720 includes four parallel-connected two-to-one power-combining building blocks 712_A (e.g., similar to 500 of FIG. 5) and provides four amplified phased-variant signals to the output network 730. The output network 730 includes a 4×4 passive network with an active output port 704 and three terminated output ports. An amplified output signal, which is a combination of the four amplified phase-variant signal is provided at the output port 704. The combination is provided by bringing back the four phases of the amplified phase-variant signals to the same phase (e.g., zero degree). Because each of the two-to-one power-combining building blocks 712_A includes two HPAs, the amplified output signal at the output port 704 has 8×G times (4×2×G) the power of the input signal A.

In the simplified representation 700B, the two-to-one power-combining building blocks 712_A are shown by representative blocks 712_B, simply depicting two cascaded amplifier symbols.

FIGS. 8A and 8B are block diagrams illustrating example implementations of 32-to-1 power-combining building blocks 800A and 800B with one and four inputs, according to certain aspects of the disclosure. The 32-to-1 power-combining building blocks 800A (hereinafter, building block 800A) includes a Butler matrix-based passive input network 810 (hereinafter, input network 810), an amplification block 820 and a Butler matrix-based passive output network 830 (hereinafter, output network 830). The input network 810 is a 4×4 passive network with four input ports, three of which are terminated and a fourth one is an input port 801. The input port 801 receives an input signal A and provides four phase-variant signals that are amplified (e.g., by a power gain of G) by the amplification block 820. The amplification block 820 includes four parallel-connected eight-to-one power-combining building blocks 822 (e.g., similar to 700A of FIG. 7A) and provides four amplified phased-variant signals to the output network 830. The output network 830 includes a 4×4 passive network with an active output port 808 and three terminated output ports. An amplified output signal, which is a combination of the four amplified phase-variant signal is provided at the output port 808. The combination is provided by bringing back the four phases of the amplified phase-variant signals to the same phase (e.g., zero degree). Because each of the eight-to-one power-combining building blocks 822 includes eight HPAs, the amplified output signal at the output port 808 has 32×G times (4×8×G) the power of the input signal A.

The 32-to-1 power-combining building block 800B (hereinafter, building block 800B) is similar to the building block 800A of FIG. 8A, except that all four input ports (801, 802, 803 and 804) are active and receive input signals A, B, C and D, respectively. Further, all four output ports (805, 806, 807 and 808) are active and provide amplified output signals that share the total power pool from 4×8=32 amplifiers, as shown in FIG. 8B. As depicted in FIG. 8B, the amplified versions of input signals A, B, C and D are provided at output ports 808, 807, 806 and 805, respectively. If power contribution of the input signals A, B, C and D to the overall input signal power are not equal, and can be respectively represented by a %, b %, c % and d %, the amplified output signals at output ports 808, 807, 806 and 805 will have the same percentile contribution to the overall output power.

Figure 9:
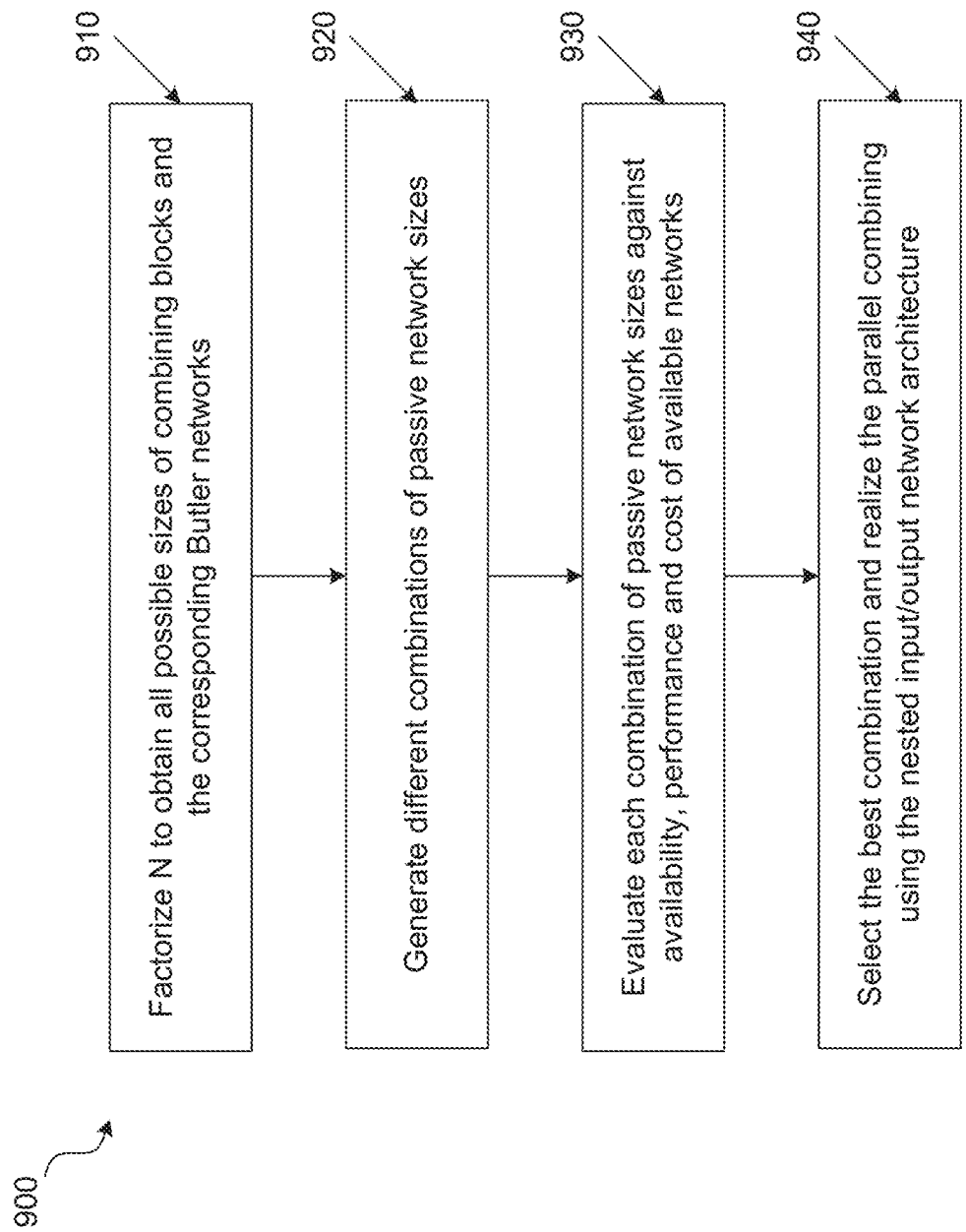
FIG. 9 is a flow diagram illustrating an example algorithm for implementing high-power combining with N high-power amplifiers (HPAs), according to some aspects of the subject technology.

FIG. 9 is a flow diagram illustrating an example algorithm 900 for implementing high-power combining with N HPAs, according to some aspects of the subject technology. The algorithm 900 starts at an operation block 910, where the number N is factorized to obtain all possible sizes (e.g., 2, 4, 8 and so on) of power-combining building blocks and corresponding Butler networks (e.g., passive input and output networks). At an operation block 920, different combinations of passive network sizes are generated. At an operation block 930, each combination of passive network sizes is evaluated against availability, performance and cost of available networks. Finally, at operation block 940, the best combination (e.g., the least expensive available combination) of power-combining building blocks and passive input and output networks is selected to realize the desired power combining circuit.

Figure 10:
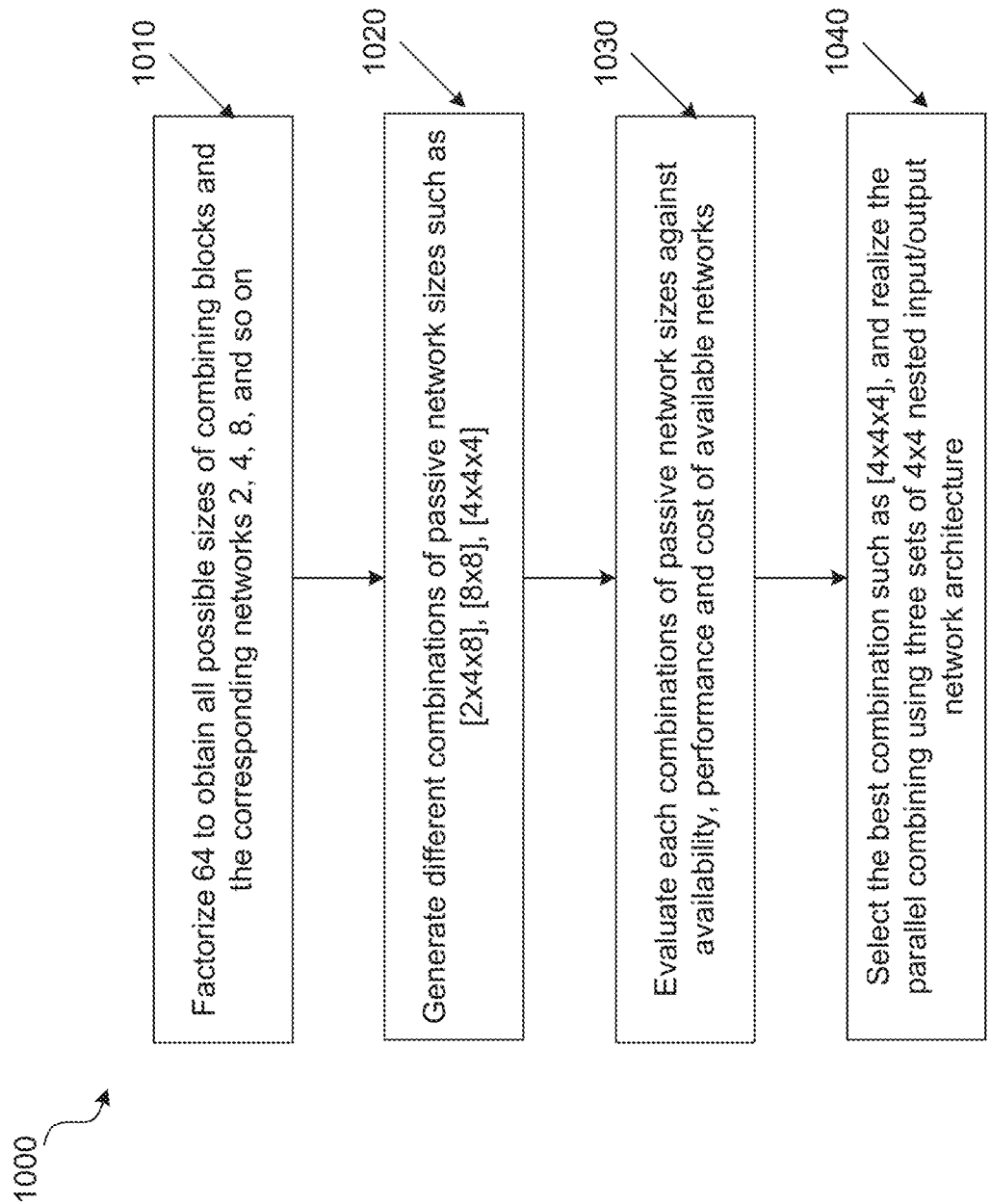
FIG. 10 is a flow diagram illustrating an example algorithm for implementing high-power combining with 64 HPAs, according to some aspects of the subject technology.

FIG. 10 is a flow diagram illustrating an example algorithm 1000 for implementing high-power combining with 64 HPAs, according to some aspects of the subject technology. The algorithm 1000 starts at an operation block 1010, where the number 64 is factorized to obtain all possible sizes (e.g., two, four, eight and so on) of power-combining building blocks and corresponding Butler networks (e.g., passive input and output networks). At an operation block 1020, different combinations of passive network sizes are generated. For example, for a 64-HPA power-combining circuit, [2×4×8], [8×8] and [4×4×4] passive networks may be used. At an operation block 1030, each combination of passive network sizes is evaluated against availability, performance and cost of available networks. For instance, one of the [2×4×8], [8×8] and [4×4×4] passive networks may be readily available and at lower cost, which can be used for implementation of the 64-HPA power-combining circuit. Finally, at operation block 1040, the best combination (e.g., the least expensive available combination) of power-combining building blocks and passive input and output networks is selected to realize the desired power combining circuit.

Figure 11:
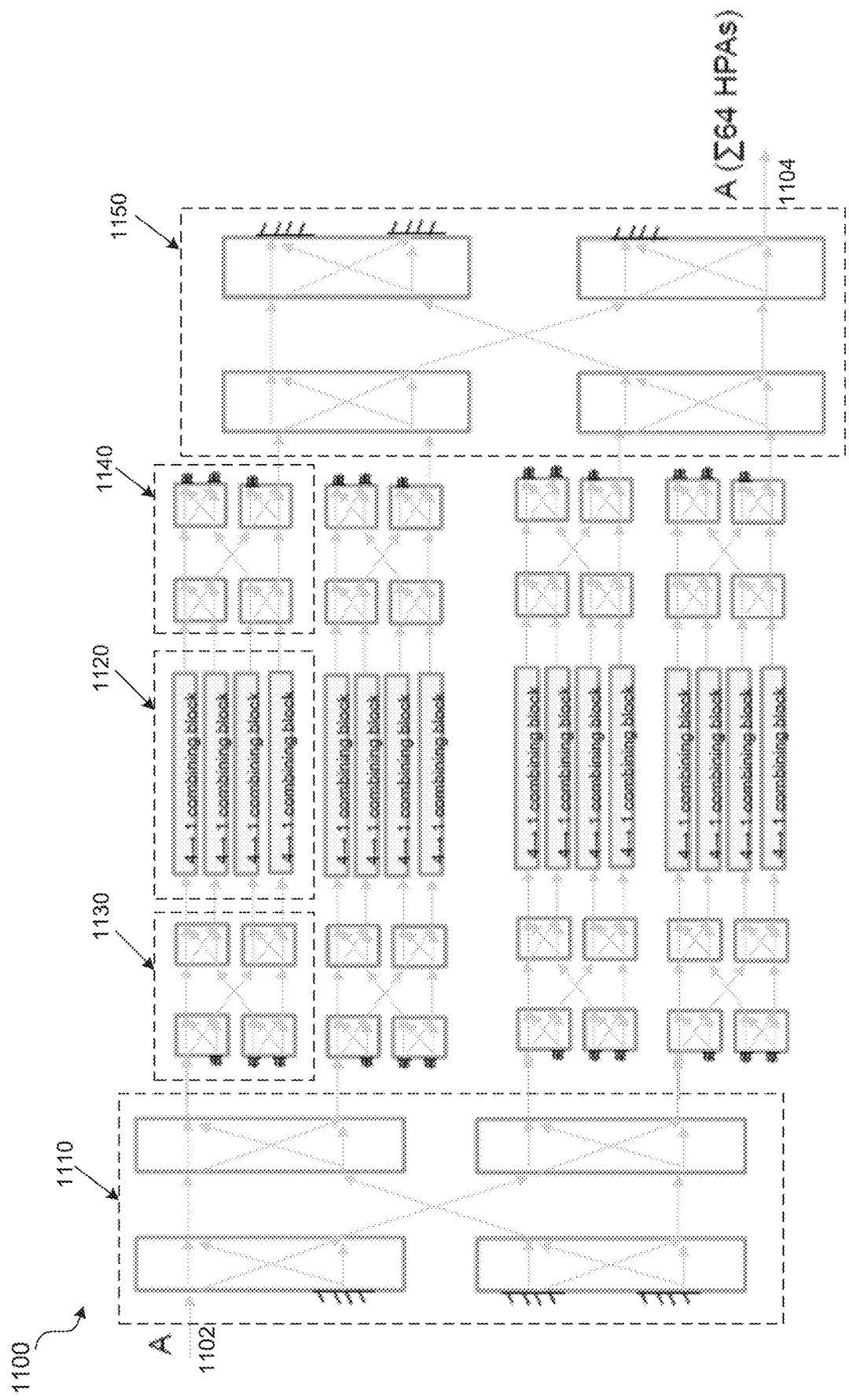
FIG. 11 is a block diagram illustrating an example 64 HPA implementation using four-to-one power-combining building blocks, according to certain aspects of the disclosure.

FIG. 11 is a block diagram illustrating an example 64-HPA implementation 1100 using four-to-one power-combining building blocks, according to certain aspects of the disclosure. The 64-HPA implementation 1100 is realized by using three sets of nested passive networks and includes two 4×4 outer passive networks 1110 and 1150, four sets of 4×4 inner passive networks 1130 and 1140 and four sets of four-to-one power-combining building blocks 1120. An input port 1102 of the outer passive networks 1110 receives an input A and other three input ports are terminated. The outer passive networks 1110 generate four phase-variant signals that are used by the Butler matrices of the four sets of inner passive networks 1130 to populate 16 phase-variant signals (four sets of four phase-variant signals). The 16 phase-variant signals are applied to 16 four-to-one power-combining building blocks (four sets of four four-to-one power-combining building blocks 1120). The amplified signals are combined by the four sets of inner passive networks 1140 and the outer passive network 1150 to generate an amplified output signal with 64×G times the power of the input signal A at an output port 1104, where G is the power gain of each HPA.

Figure 12:
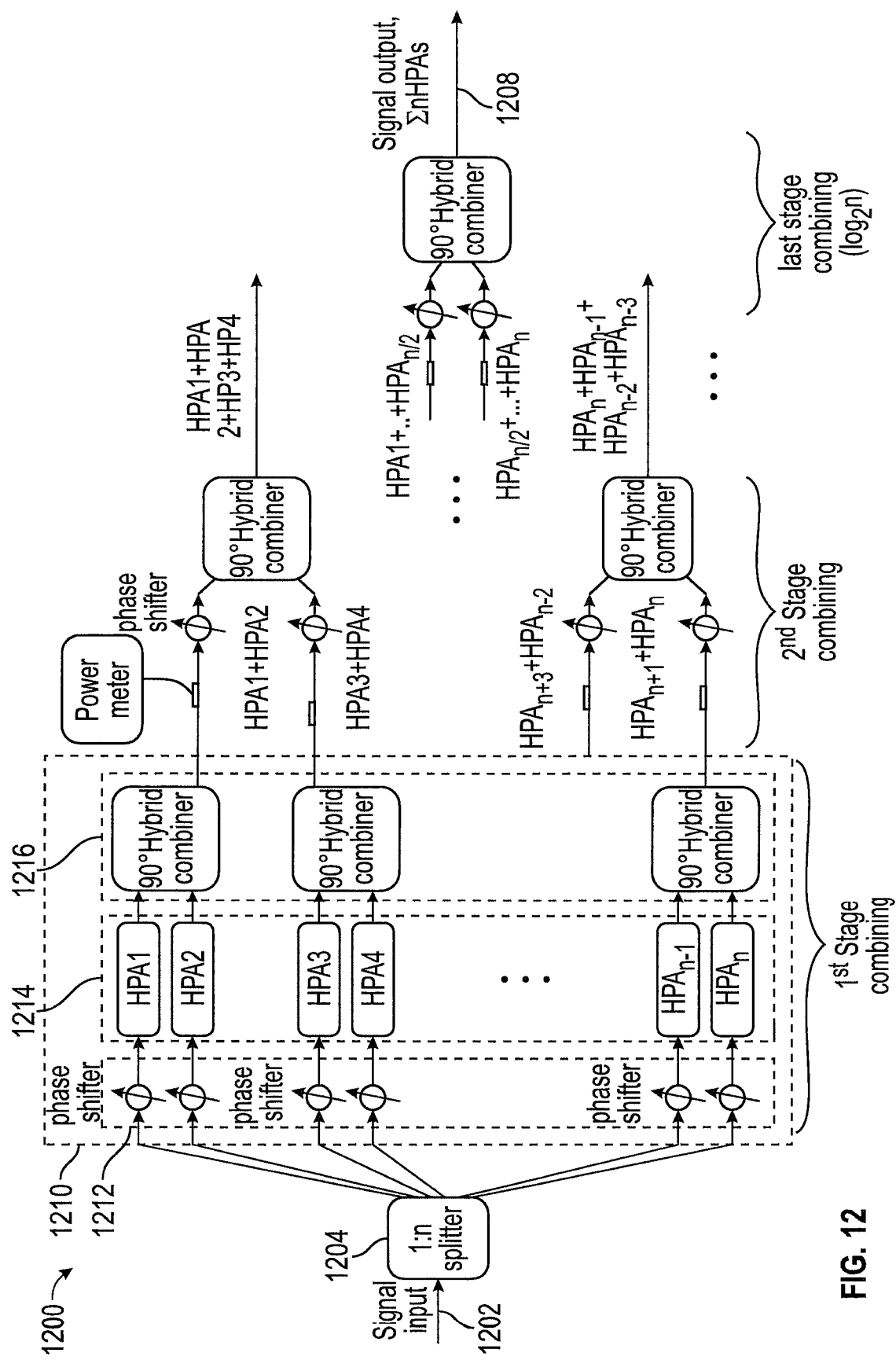
FIG. 12 is a block diagram illustrating an existing multistage power-combining apparatus.

FIG. 12 is a block diagram illustrating an existing multistage power-combining apparatus 1200. The existing multistage power-combining apparatus 1200 receives an input signal at an input port 1202 of a 1:n power splitter 1204 that splits the input signal into n split signals and amplifies and combines the split signals by using N stages, where N is equal to $\log_2 n$. For example, a first stage 1210 includes a phase-shifter block 1212, a HPA block 1214 and a combiner block 1216. The phase-shifter block 1212 includes n phase shifters to generate n phase-variant signals. The HPA block 1214 includes n HPAs that can amplify the n phase-variant signals, and combiner block 1216 includes a number of (n/2) 90° hybrid combiners that combine the signals from pairs of HPAs. The first stage 1210 generates n/2 amplified signals that are combined in the following stages by using similar phase shifters and combiners.

In stark contrast, the subject technology readily implements high-power combining without using costly parts such as phase shifters and individual 90° hybrid combiners by employing various power-combining building blocks (e.g., two-to-one, four-to-one, eight-to-one building blocks) disclosed herein and on-the-shelf butler matrix-based passive networks.

Figure 13:
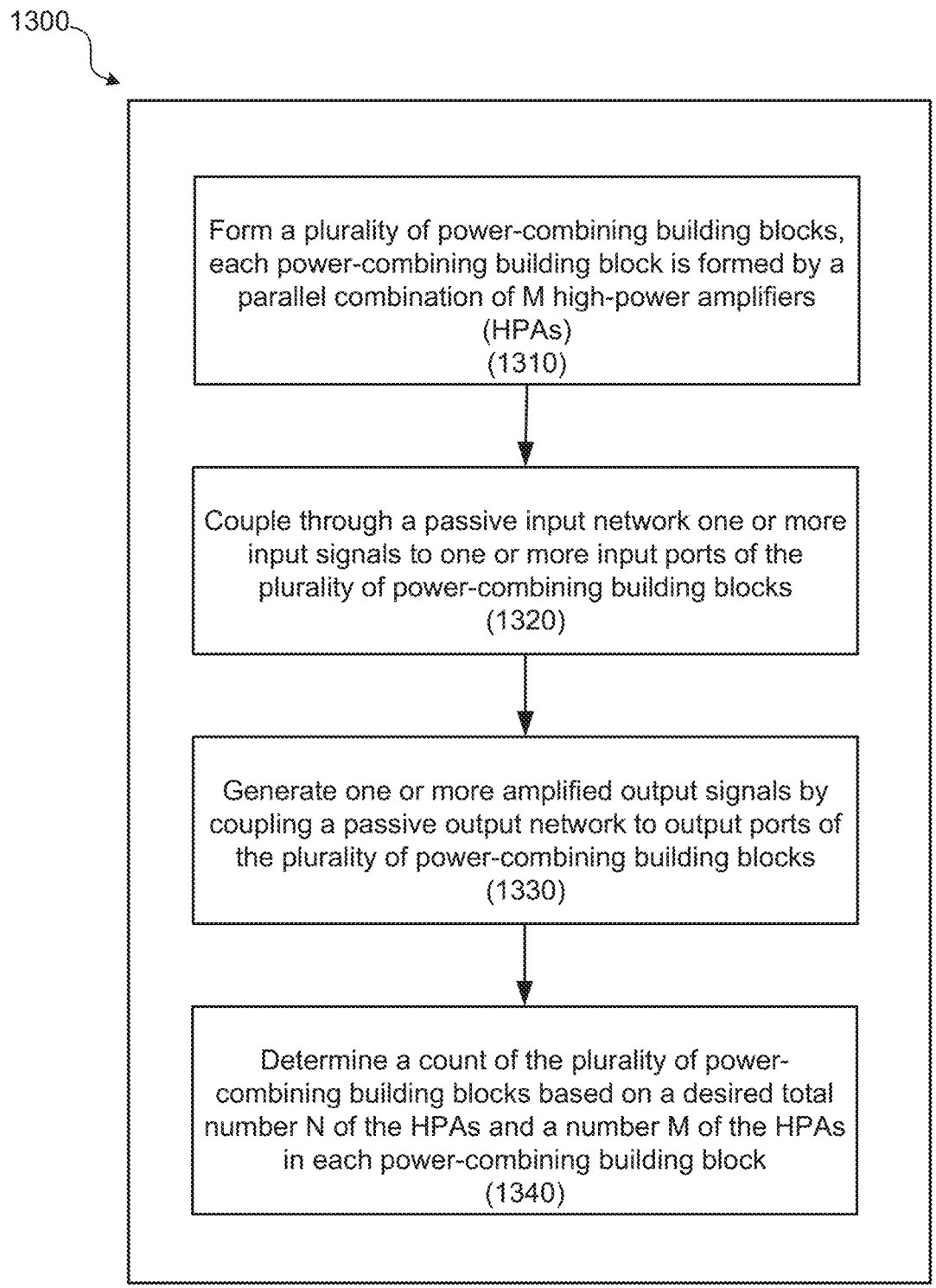
FIG. 13 is a flow diagram illustrating an example method for high-power combining, according to some aspects of the subject technology.

FIG. 13 is a flow diagram illustrating an example method 1300 for high-power combining, according to some aspects of the subject technology. The method 1300 includes forming multiple power-combining building blocks (e.g., 600 of FIG. 6 or 822 of FIG. 8A). Each power-combining building block is formed by a parallel combination of M HPAs (e.g., 620 of FIG. 6) (1310). The method further includes coupling, through a passive input network (e.g., 610 of FIG. 6), one or more input signals (e.g., A or A, B, C and D of FIGS. 8A and 8B) to one or more input ports (e.g., 801, 802, 803 and 804 of FIG. 8B) of the multiple power-combining building blocks (1320). One or more amplified output signals are generated by coupling a passive output network to output ports of the multiple power-combining building blocks (1330). A count of the multiple power-combining building blocks is determined based on a desired total number N (e.g., 64) of the HPAs and a number M (e.g., eight in FIG. 8A) of the HPAs in each power-combining building block (e.g., 822 of FIG. 8A). (1340). Each power-combining building block of the multiple power-combining building blocks is coupled in parallel to a respective passive input network (e.g., 810 of FIG. 8A) and a respective passive output network (e.g., 830 of FIG. 8A).

Figure 14:
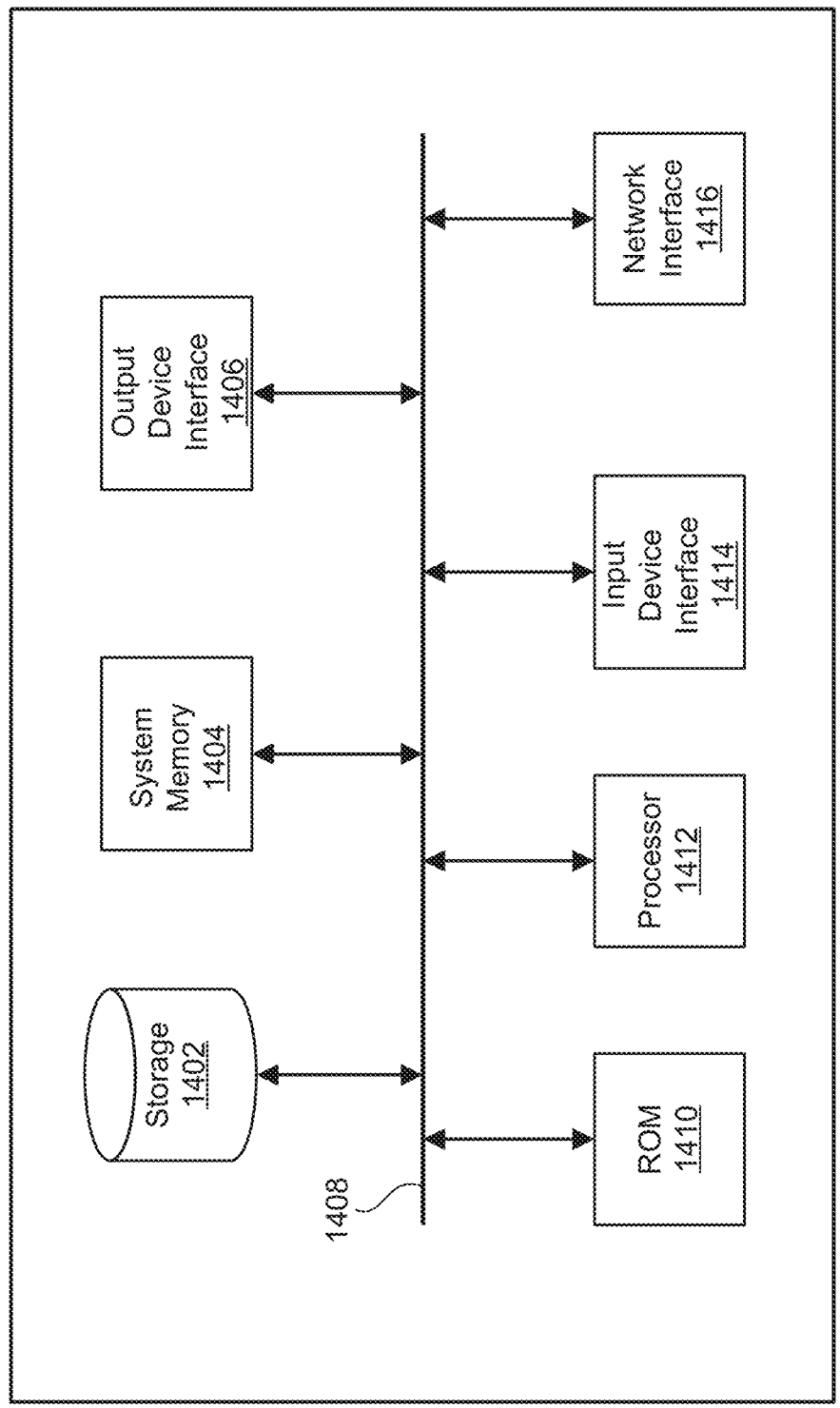
FIG. 14 is a block diagram conceptually illustrating an electronic system with which aspects of the subject technology are implemented.

FIG. 14 is a block diagram conceptually illustrating an electronic system 1400 with which aspects of the subject technology are implemented. Electronic system 1400, for example, can be a desktop computer, a laptop computer or a tablet computer. Such an electronic system may include various types of computer-readable media and interfaces for various other types of computer-readable media. Electronic system 1400 includes bus 1408, processing unit(s) 1412, system memory 1404, read-only memory (ROM) 1410, permanent storage device 1402, input device interface 1414, output device interface 1406, and network interface 1416, or subsets and variations thereof.

Bus 1408 collectively represents all system, peripheral, and chipset buses that communicatively connect the numerous internal devices of electronic system 1400. In one or more implementations, bus 1408 communicatively connects processing unit(s) 1412 with ROM 1410, system memory 1404, and permanent storage device 1402. From these various memory units, processing unit(s) 1412 retrieves instructions to execute and data to process in order to execute the processes of the subject disclosure. The processing unit(s) 1412 can be a single processor or a multicore processor in different implementations. In some aspects, the processing unit(s) 1412 may be used to implement various algorithms and methods disclosed herein, for example, method and algorithms of FIGS. 9 and 10.

ROM 1410 stores static data and instructions that are needed by processing unit(s) 1412 and other modules of the electronic system. Permanent storage device 1402, on the other hand, is a read-and-write memory device. This device is a nonvolatile memory unit that stores instructions and data even when electronic system 1400 is off. One or more implementations of the subject disclosure use a mass-storage device (such as a magnetic or optical disk and its corresponding disk drive) as permanent storage device 1402.

Other implementations use a removable storage device (such as a floppy disk, flash drive, and its corresponding disk drive) as permanent storage device 1402. Like permanent storage device 1402, system memory 1404 is a read-and-write memory device. However, unlike storage device 1402, system memory 1404 is a volatile read-and-write memory, such as random access memory. System memory 1404 stores any of the instructions and data that processing unit(s) 1412 needs at runtime. In one or more implementations, the processes of the subject disclosure are stored in system memory 1404, permanent storage device 1402, and/or ROM 1410. From these various memory units, processing unit(s) 1412 retrieves instructions to execute and data to process in order to execute the processes of one or more implementations.

Bus 1408 also connects to input and output device interfaces 1414 and 1406. Input device interface 1414 enables a user to communicate information and select commands to the electronic system. Input devices used with input device interface 1414 include, for example, alphanumeric keyboards and pointing devices (also called "cursor control devices"). Output device interface 1406 enables, for example, the display of images generated by electronic system 1400. Output devices used with output device interface 1406 include, for example, printers and display devices, such as a liquid crystal display (LCD), a light emitting diode (LED) display, an organic light-emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 14, bus 1408 also couples electronic system 1400 to a network (not shown) through network interface 1416. In this manner, the computer can be a part of a network of computers (such as a local area network ("LAN"), a wide area network ("WAN"), or an Intranet, or a network of networks, such as the Internet. Any or all components of electronic system 1400 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer-readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra-density optical discs, any other optical or magnetic media, and floppy disks. In one or more implementations, the computer-readable media does not include carrier waves and electronic signals passing wirelessly or over wired connections, or any other ephemeral signals. For example, the computer-readable media may be entirely restricted to tangible, physical objects that store information in a form that is readable by a computer. In one or more implementations, the computer-readable media is nontransitory computer-readable media, computer readable storage media, or nontransitory computer readable storage media.

In one or more implementations, a computer program product (also known as a program, software, software application, script, or code) can be written in any form of programming language including compiled or interpreted languages, or declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified, and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meanings unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. An apparatus for high-power combining, the apparatus comprising:
   a plurality of power-combining building blocks;
   a passive input network configured to couple one or more input signals to one or more input ports of the plurality of power-combining building blocks; and
   a passive output network configured to couple to output ports of the plurality of power-combining building blocks and to generate one or more amplified output signals,
   wherein:
   each power-combining building block of the plurality of power-combining building blocks comprises M high-power amplifiers (HPAs) coupled in parallel to a respective passive input network and a respective passive output network, and
   a count of the plurality of power-combining building blocks is determined based on a desired total number N of the HPAs and a number M of the HPAs in each power-combining building block.

2. The apparatus of claim 1, wherein the passive input network comprises a plurality of Butler matrices configured to generate multiple phase variants of the one or more input signals.

3. The apparatus of claim 2, wherein a count of the multiple phase variants is determined by dividing the desired total number N by the number M of the HPAs in each power-combining building block.

4. The apparatus of claim 2, wherein the M HPAs are configured to amplify the multiple phase variants of one or more input signals and to generate multiple amplified signals with phase variations.

5. The apparatus of claim 4, wherein the passive output network comprises a plurality of Butler matrices configured to receive the multiple amplified signals with phase variations and to generate the one or more amplified output signals.

6. The apparatus of claim 1, wherein each power-combining building block of the plurality of power-combining building blocks comprises an M-combining building block, wherein M comprises one of a two, four, eight or 16.

7. The apparatus of claim 1, wherein the one or more input signals comprise a single input signal, and wherein the amplified output signals comprise a single amplified signal having a power of N*G times a power of the single input signal, where G is a power gain of an equivalent HPA of the M HPAs.

8. The apparatus of claim 1, wherein the desired total number N is 64, and wherein the number M of the HPAs in each power-combining building block M is one of two, four or eight.

9. The apparatus of claim 8, wherein the number M of the HPAs in each power-combining building block M is eight and the passive input network comprises an 8×8 passive input network comprising 12 Butler 2×2 matrices, and wherein the passive output network comprises an 8×8 passive output network comprising 12 Butler 2×2 matrices.

10. The apparatus of claim 8, wherein the number M of the HPAs in each power-combining building block M is four and the passive input network comprises a 4×4 passive input network, wherein the passive output network comprises a 4×4 passive output network, and wherein the plurality of power-combining building blocks further comprise 4×4 passive middle networks.

11. The apparatus of claim 1, wherein a count of the one or more amplified output signals is equal to a count of the one or more input signals, and wherein output power distribution between the one or more amplified output signals is similar to a corresponding power distribution of the one or more input signals.

12. The apparatus of claim 1, wherein a power level of each of the M HPAs is within a range of about 1 W-300 W.

13. A method for high-power combining, the method comprising:
    forming a plurality of power-combining building blocks, wherein each power-combining building block of the plurality of power-combining building blocks is formed by a parallel combination of M HPAs;
    coupling, through a passive input network, one or more input signals to one or more input ports of the plurality of power-combining building blocks;
    generating one or more amplified output signals by coupling a passive output network to output ports of the plurality of power-combining building blocks; and
    determining a count of the plurality of power-combining building blocks based on a desired total number N of the HPAs and a number M of the HPAs in each power-combining building block,
    wherein a power-combining building block of the plurality of power-combining building blocks is coupled in parallel to a respective passive input network and a respective passive output network.

14. The method of claim 13, wherein the passive input network comprises a plurality of Butler matrices, wherein the method further comprises generating multiple phase variants of the one or more input signals by using the plurality of Butler matrices, and wherein coupling the passive output network comprises combining multiple amplified signals with phase variations and generating the one or more amplified output signals by using a plurality of Butler matrices.

15. The method of claim 13, wherein the desired total number N is 64, and wherein the number M of the HPAs in each power-combining building block M is one of two, four or eight.

16. The method of claim 13, wherein determining the count of the plurality of power-combining building blocks comprises:
    factorizing, via a processor, the desired total number N to obtain possible values of the number M of the HPAs in each power combining, and
    selecting a value among the values of the possible values of the number M of the HPAs in each power-combining building block based on a computer analysis of availabilities and costs of corresponding passive input networks and passive out networks.

17. The method of claim 13, wherein a count of the one or more amplified output signals is equal to a count of the one or more input signals, wherein output power distribution between the one or more amplified output signals is similar to a corresponding power distribution of the one or more input signals, and wherein a power level of each of the M HPAs is within a range of about 1 W-300 W.

18. A power-combining building block comprising:
    a passive input network configured to generate phase variants of an input signal;
    a plurality of HPAs coupled in parallel to the passive input network and configured to amplify the phase variants of the input signal to generate a plurality of phase-variant amplified output signals; and
    a passive output network configured to combine the plurality of phase-variant amplified output signals to generate an amplified output signal,
    wherein sizes of the passive input network and the passive output network are equal and are determined based on the count of the plurality HPAs.

19. The power-combining building block of claim 18, wherein a power level of each of the M HPAs is within a range of about 1 W-300 W, and wherein the passive input network and the passive output network comprise Butler matrices.

20. The power-combining building block of claim 18, wherein a count of the plurality HPAs is one of two, four, eight or 16.

* * * * *